United States Patent
Song et al.

(10) Patent No.: US 6,313,670 B1
(45) Date of Patent: Nov. 6, 2001

(54) INTEGRATED DRIVER CIRCUITS HAVING CURRENT CONTROL CAPABILITY

(75) Inventors: Ki-whan Song; Chan-jong Park, both of Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/433,099

(22) Filed: Nov. 3, 1999

(30) Foreign Application Priority Data

Nov. 4, 1998 (KR) .................................................. 98-47127
Sep. 9, 1999 (KR) .................................................. 99-38400

(51) Int. Cl.$^7$ ..................................................... H03K 3/00
(52) U.S. Cl. ........................................... 327/108; 327/543
(58) Field of Search ..................................... 327/108, 109, 327/77, 89, 540, 541, 543, 363; 323/316, 313

(56) References Cited

U.S. PATENT DOCUMENTS

| 3,988,691 | 10/1976 | Shih | 330/15 |
|---|---|---|---|
| 4,481,625 | 11/1984 | Roberts et al. | 370/85 |
| 4,941,153 | 7/1990 | Kelley et al. | 375/36 |
| 5,194,765 | * 3/1993 | Dunlop et al. | 327/112 |
| 5,254,883 | 10/1993 | Horowitz et al. | 307/443 |
| 5,424,662 | 6/1995 | Bonaccio | 327/55 |
| 5,450,026 | 9/1995 | Morano | 326/84 |
| 5,818,269 | 10/1998 | Brown et al. | 327/108 |
| 5,880,599 | 3/1999 | Bruno | 326/56 |
| 5,917,349 | 6/1999 | Nguyen | 327/108 |
| 5,920,204 | 7/1999 | Bruno | 326/86 |
| 5,939,926 | 8/1999 | Uber | 327/382 |
| 6,094,075 | * 7/2000 | Garrett, Jr. et al. | 327/108 |

* cited by examiner

*Primary Examiner*—Toan Tran
(74) *Attorney, Agent, or Firm*—Myers Bigel Sibley & Sajovec

(57) ABSTRACT

A current control circuit capable of minimizing changes in an output high voltage VOH and an output low voltage VOL and quickly and accurately bringing a divided voltage to a steady state, and a packet-type semiconductor memory device including the current control circuit. The current control circuit includes a first differential amplification type buffer for transmitting the voltage of a first pad, that is, the output high voltage VOH, without change in response to a current control enable signal, a second differential amplification type buffer for transmitting the voltage of a second pad, that is, the output low voltage VOL, without change in response to the current control enable signal, and a voltage divider for dividing a voltage ranging between the voltage outputs of the first and second differential amplification buffers, and outputting the divided voltage. Accordingly, in the packet-type semiconductor memory device including the current control circuit, the current control circuit minimizes changes in the output high voltage VOH and the output low voltage VOL and quickly and accurately brings a divided voltage to a steady state, so that the current driving capability of an output driver for driving the second pad can be quickly controlled.

18 Claims, 5 Drawing Sheets

INTEGRATED DRIVER CIRCUITS HAVING CURRENT CONTROL CAPABILITY

BACKGROUND OF THE INVENTION

1. Field of the Invention

The present invention relates to a packet-type semiconductor memory device, and more particularly, to a current control circuit for controlling the current driving capability of an output driver in a packet-type semiconductor memory device.

2. Description of the Related Art

Recently, semiconductor memory devices which receive data and addresses in units of a packet, such as, RamBus DRAMs, have been put into use to achieve high-speed operation of semiconductor memory devices. In a system adopting the packet-type semiconductor memory device, as shown in FIG. 1, a memory controller 109 and a plurality of memory devices 101 through 108 are commonly connected to signal lines B1 through Bn which are typically called channels. Thus, the packettype semiconductor memory device includes a current control circuit for finely controlling the current driving capability of an output driver according to the size of a load which is applied to a pad.

FIG. 2 is a circuit diagram of a packet-type semiconductor memory device including a conventional current control circuit. Here, only circuits associated with the current control of an output driver are shown.

Referring to FIG. 2, the semiconductor memory device includes first and second pads P21 and P22, an output driver O21, a current control circuit CT21, and a control circuit L21. The conventional current control circuit CT21 includes first and second transfer gates T21 and T22, a voltage divider, a comparator C21, and a current control counter D21. The first transfer gate T21 transfers the voltage of the first pad P21, that is, an output high voltage (VOH) in response to a current control enable signal CCTG. The second transfer gate T22 transfers the voltage of the second pad P22, that is, an output low voltage (VOL) in response to the current control enable signal CCTG. The voltage divider includes resistors R21 and R22, and divides a voltage ranging between the outputs of the first and second transfer gates T21 and T22 and outputs a divided voltage Vcmp. The comparator C21 compares the divided voltage Vcmp with the reference voltage Vref. The current control counter D21 generates control bits ICTRO through ICTR5 for controlling the current driving capability of the output driver O21 in response to the output of the comparator C21.

However, in the conventional current control circuit CT21, when the absolute values of the resistances of the resistors R21 and R22 of the voltage divider are made small to quickly bring the divided voltage Vcmp to a steady state, an increased amount of current flows through the resistor R21 and R22, so that the levels of the output high voltage VOH and output low voltage VOL are changed. Accordingly, the divided voltage Vcmp becomes different from an original target value, that is, (VOH+VOL)/2. However, when the amount of current flowing through the resistors R21 and R22 is reduced by increasing the absolute values of the resistances of the resistors R21 and R22 to prevent such a problem, the amount of time taken for the divided voltage Vcmp to reach a steady state greatly increases.

Also, the conventional current control circuit CT21 uses transfer gates as transfer means for transferring the voltage VOH of the first pad and the voltage VOL of the second pad, such that the divided voltage Vcmp is different from an original target value even if the effective resistances of the first and second transfer gates T21 and T22 become different from each other due to factors such as a change in the manufacturing process, a change in temperature, or the like.

SUMMARY OF THE INVENTION

An object of the present invention is to provide a current control circuit which can minimize variations in an output high voltage (VOH) and an output low voltage (VOL) and quickly and accurately bring a divided voltage to a steady state, in a packet-type semiconductor memory device.

Another object of the present invention is to provide a packet-type semiconductor memory device including a current control circuit which can minimize variations in an output high voltage (VOH) and an output low voltage (VOL) and quickly and accurately bring a divided voltage to a steady state.

Accordingly, to achieve the first object of the present invention, there is provided a current control circuit including: a first transfer means for transmitting the voltage of a first pad in response to a current control enable signal; and a second transfer means for transmitting the voltage of a second pad in response to the current control enable signal. The first and second transfer means are buffers.

The current control circuit further includes a voltage divider, a comparator, and a current control counter. The voltage divider divides a voltage ranging between the voltage outputs of the first and second transfer means and outputting the divided voltage. The comparator compares the divided voltage with a reference voltage. The current control counter generates control bits for controlling the current driving capability of the output driver, in response to the output of the comparator.

It is preferable that the buffer is a differential amplification type buffer, and that the voltage divider is a current mirror type voltage divider. The voltage divider can be a resistor ladder type voltage divider.

To achieve the second object of the present invention, there is provided a semiconductor memory device including: first and second pads; an output driver connected to the second pad, for driving the second pad; and a current control circuit for controlling the current driving capability of the output driver. The current control circuit includes: a first buffer for transmitting the voltage of the first pad in response to a current control enable signal; a second buffer for transmitting the voltage of the second pad in response to the current control enable signal; a voltage divider Tor dividing a voltage ranging between the voltage outputs of the first and second buffers and outputting a divided voltage; a comparator for comparing the divided voltage with a reference voltage; and a current control counter for generating control bits for controlling the current driving capability of the output driver, in response to the output of the comparator.

It is preferable that the first and second buffers are differential amplification type buffers, and that the voltage divider is a current mirror type voltage divider. The voltage divider can be a typical resistor ladder type voltage divider.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENT

Figure 1:
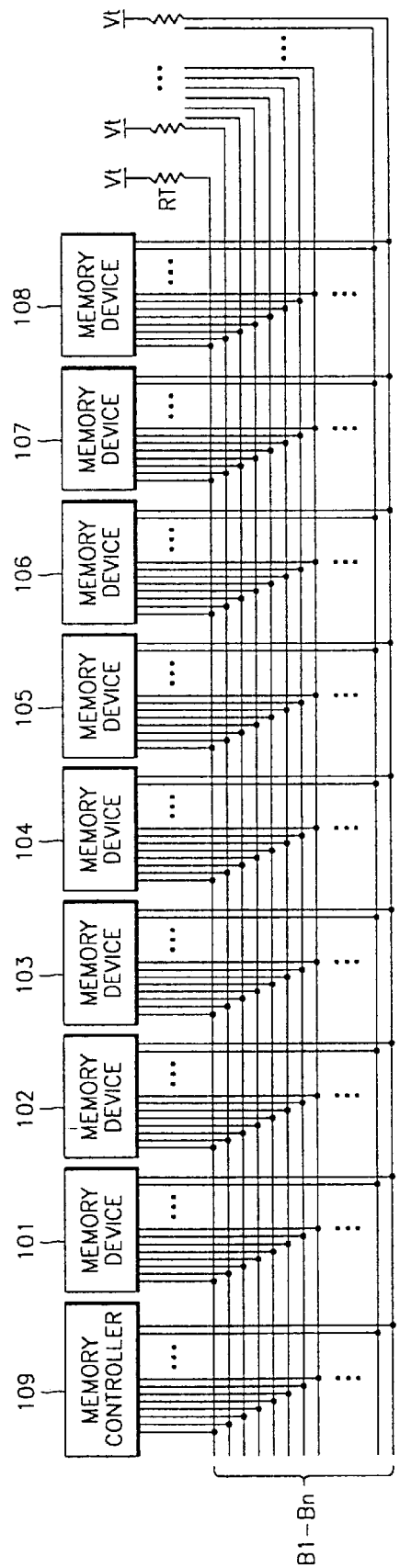
FIG. 1 is a block diagram schematically illustrating a packet-type semiconductor memory device.

The attached drawings for illustrating a preferred embodiment of the present invention, and the contents written on the attached drawings must be referred to in order to gain a sufficient understanding of the merits of the present invention and the operation thereof and the objectives accomplished by the operation of the present invention.

Hereinafter, the present invention will be described in detail by explaining a preferred embodiment of the present invention with reference to the attached drawings. Like reference numerals in the drawings denote the same members.

Figure 3:
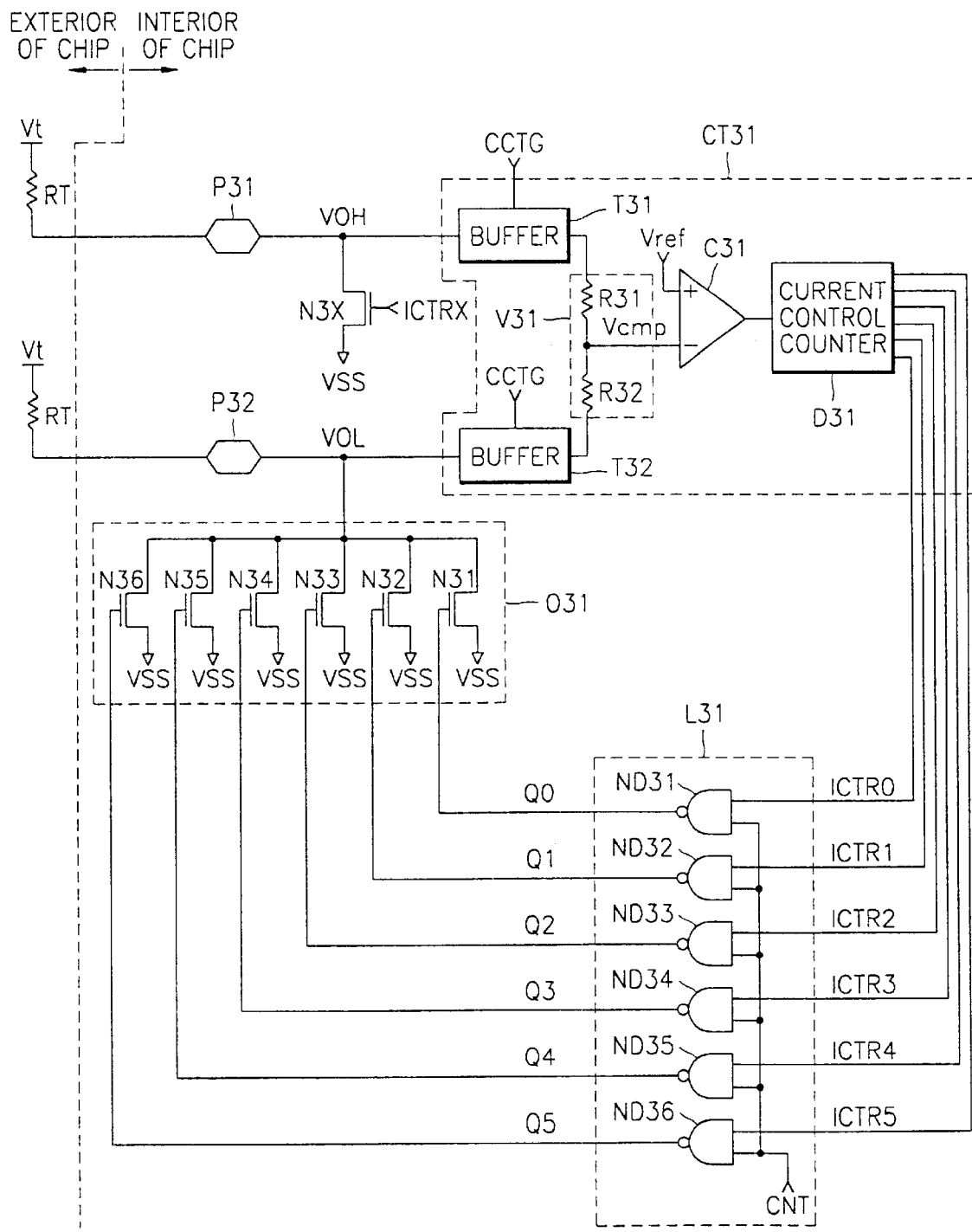
FIG. 3 is a circuit diagram schematically illustrating a packet-type semiconductor memory device including a current control circuit according to the present invention.

Referring to FIG. 3, a packet-type semiconductor memory device including a current control circuit according to the present invention includes first and second pads P31 and P32, an output driver O31, a current control circuit CT31, and a control circuit L31. Here, only circuits associated with the current control of the output driver are shown.

The output driver O31 is connected to the second pad P32 and drives the same. The output driver O31 includes a plurality of pull-down NMOS transistors N31 through N36 which are connected to one another in parallel between the second pad P32 and the ground voltage VSS. As the number of transistors which are turned on among the pull-down NMOS transistors N31 through N36 increases, the current driving capability of the output driver O31 is enhanced.

The current control circuit CT31 divides a voltage ranging between the outputs of the first and second pads P31 and P32 in response to a current control enable signal CCTG, compares a divided voltage Vcmp with a reference voltage Vref, and generates control bits ICTR0 through ICTR5 for controlling the current driving capability of the output driver O31 according to the results of the comparison.

Particularly, the current control circuit CT31 includes a first buffer T31 for transmitting the output high voltage VOH of the first pad, and a second buffer T32 for transmitting the output low voltage VOL of the second pad. Here, the first buffer T31 outputs the output high voltage VOH of the first pad to the output port without changing in response to the current control enable signal CCTG. The second buffer T32 outputs the output low voltage VOL of the second pad to the output port without changing in response to the current control enable signal CCTG. It is preferable that the first and second buffers T31 and T32 are differential amplification type buffers.

The current control circuit CT31 further includes a voltage divider V31, a comparator C31, and a current control counter D31. The voltage divider V31 divides a voltage ranging between the outputs of the first and second buffers T31 and T32, and outputs the divided voltage Vcmp. The voltage divider V31 is a resistor ladder type voltage divider, and includes resistors R31 and R32 connected to each other in series between the output ports of the first and second buffers T31 and T32. The divided voltage Vcmp is output from the junction between the resistors R31 and R32. Also, the resistors R31 and R32 have the same resistance, and accordingly, the divided voltage Vcmp is (VOH+VOL)/2.

The comparator C31 compares the divided voltage Vcmp with the reference voltage Vref, and the current control counter D31 generates control bits ICTR0 through ICTR5 for controlling the current driving capability of the output driver O31 in response to the output of the comparator C31.

The control circuit L31 receives the control bits ICTR0 through ICTR5 in response to an enable signal CNT, and generates control signals Q0 through Q5 for controlling the current driving capability of the output driver O31. The control signals Q0 through Q5 are applied to the gates of the pull-down NMOS transistors N31 through N36 in the output driver O31, respectively. The pull-down NMOS transistors N31 through N36 are turned on or turned off depending on the logic values of the control signals Q0 through O5.

A pull-down NMOS transistor N3X, which is controlled by a signal ICTRX, is connected between the first pad P31 and the ground voltage VSS.

In the operation of controlling the current driving capability of the output driver O31, when the pull-down NMOS transistor N3X is turned off by the signal ICTRX, the voltage of the first pad P31 is an output high voltage VOH. Also, when one among the pull-down NMOS transistors N31 through N36 of the output driver O31 is turned on, a voltage Vt, which is connected to the second pad P32 via a channel outside a chip, is divided at a ratio of a resistance Rt to the channel resistance of the turned-on pull-down NMOS transistor, thus determining the voltage of the second pad P32. At this time, the voltage of the second pad P32 is an output low voltage VOL.

Then, when the current control enable signal CCTG is activated to logic "high", the first and second buffers T31 and T32 are activated. The first buffer T31 transfers the output high voltage VOH of the first pad to the output port without change, and the second buffer T32 transfers the output low voltage VOL of the second pad to the output port without change. A voltage between the outputs of the first and second buffers T31 and T32 is divided by the voltage divider V31, thus determining the divided voltage Vcmp of (VOH+VOL)/2.

When the output low voltage is greater than a target value, and the divided voltage Vcmp is thus greater than the reference voltage Vref, the number of pull-down NMOS transistors which are turned on via the comparator C31 and the current control counter D31, among the pull-down NMOS transistors N31 through N36 of the output driver O31, increases. Accordingly, the current driving capability of the output driver O31 is improved, so that the output low voltage VOL is lowered.

In this way, the current driving capability of the output driver is finely controlled according to the size of a load which is applied to a pad.

Figure 4:
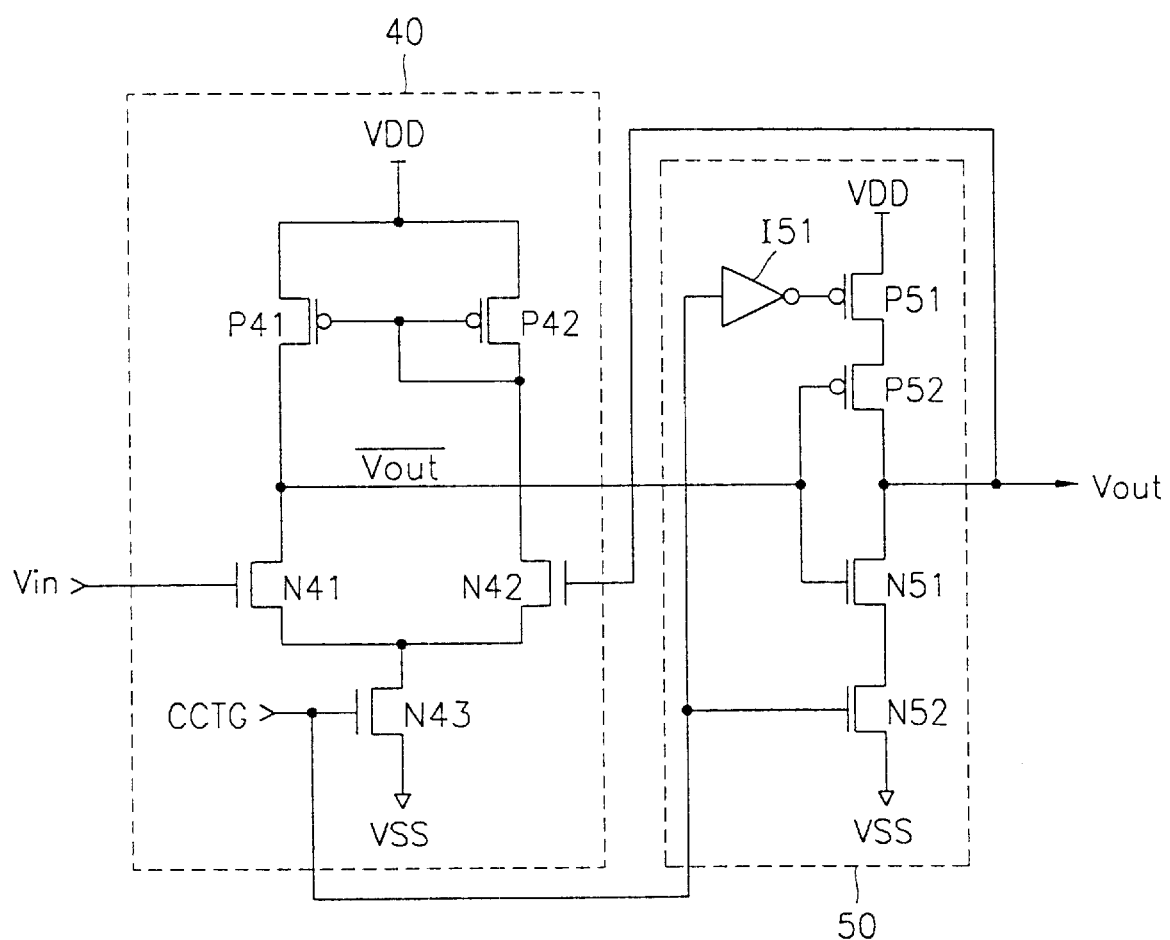
FIG. 4 is a circuit diagram of an embodiment of the buffer shown in FIG. 3.

FIG. 4 is a circuit diagram of an embodiment of the buffers T31 and T32 shown in FIG. 3. Referring to FIG. 4, each of the buffers T31 and T32 includes a differential amplification unit 40 and an inversion buffer unit 50.

The differential amplification unit 40 differentially amplifies an input signal Vin and the output signal Vout of the buffer in response to the enable signal CCTG, and outputs the inverted output signal $\overline{Vout}$ of the buffer. The inversion buffer unit 50 inversion-buffers the output, that is, the inverted output signal $\overline{Vout}$, of the differential amplification unit 40, in response to the enable signal CCTG, and outputs the result as the output signal Vout of the buffer unit 50.

Here, the differential amplification unit 40 includes PMOS load transistors P41 and P42, NMOS differential input transistors N41 and N42, and an NMOS current source transistor N43. The inversion buffer unit 50 includes PMOS transistors P51 and P52 and NMOS transistors N51 and N52. It is evident that the differential amplification unit 40 and the inversion buffer unit 50 can be configured differently by using different circuits.

The enable signal CCTG corresponds to the current control enable signal CCTG of FIG. 3, and the input signal Vin corresponds to the output high voltage VOH or output low voltage VOL of FIG. 3. The output signal Vout is connected to the voltage divider V31 of FIG. 3.

In the operation of the buffer, when the current control enable signal CCTG is activated to logic "high", the NMOS transistor N43, the PMOS transistor P51, and the NMOS transistor N52 are all turned on. Here, when the output signal Vout is lower than the input signal Vin, the channel conductance of the NMOS transistor N41 becomes greater than that of the NMOS transistor N42, so that more current flows via the NMOS transistor N41 than via the NMOS transistor N42. Thus, the output of the differential amplification unit 40, that is, the level of the inverted output signal $\overline{Vout}$, is lowered.

Accordingly, the PMOS transistor P52 in the inversion buffer unit 50 is turned on more strongly, and the NMOS transistor N51 is turned off more strongly. Thus, the level of the output signal Vout increases to make the levels of the input signal Vin and output signal Vout identical. On the other hand, when the output signal Vout is higher than the input signal Vin, the PMOS transistor P52 and the NMOS transistor N51 operate in an opposite way to the above-described operation. Thus, the level of the output signal Vout decreases, so that the levels of the input signal Vin and output signal Vout become the same.

Figure 2:
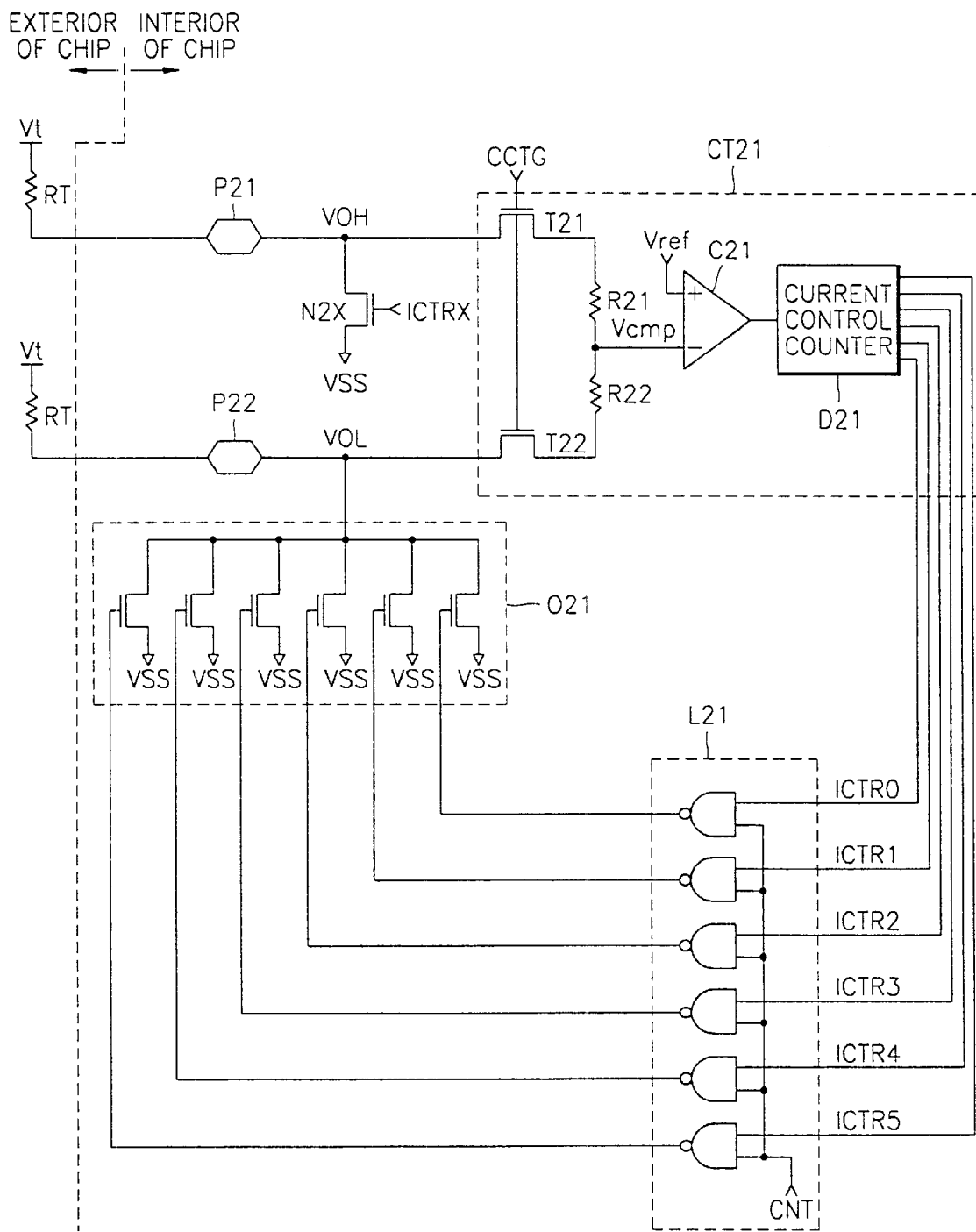
FIG. 2 is a circuit diagram schematically illustrating a packet-type semiconductor memory device including a conventional current control circuit.

That is, the buffer outputs the input signal Vin to the output port in response to the current control enable signal CCTG, without change. In other words, when the level of the input signal Vin is the same as the voltage VOH of the first pad shown in FIG. 2, the level of the output signal Vout becomes the same as the voltage VOH of the first pad. Also, when the level of the input signal Vin is the same as the voltage VOL of the second pad shown in FIG. 2, the level of the output signal Vout becomes the same as the voltage VOL of the second pad.

Accordingly, in the current control circuit CT31, shown in FIG. 3, according to the present invention, a differential amplification type buffer as shown in FIG. 4, which consumes no current in the input port and outputs an input voltage without change, is used as a transfer means for transmitting the output high voltage VOH of the first pad and the output low voltage VOL of the second pad. Thus, changes in the output high voltage VOH and the output low voltage VOL can be prevented. Also, since a current flowing via the resistors R31 and R32 in the voltage divider V31 is supplied from the buffer T31, a great amount of current flows via the resistors R31 and R32, so that the divided voltage Vcmp quickly reaches a steady state.

Also, in the current control circuit shown in FIG. 3, the voltage divider V31 is realized as a resistor ladder. However, it is preferable that the voltage divider V31 is realized as a current mirror to obtain a divided voltage Vcmp having an accurate value of (VOH+VOL)/2 despite changes in the manufacturing process, temperature, or the like.

Figure 5:
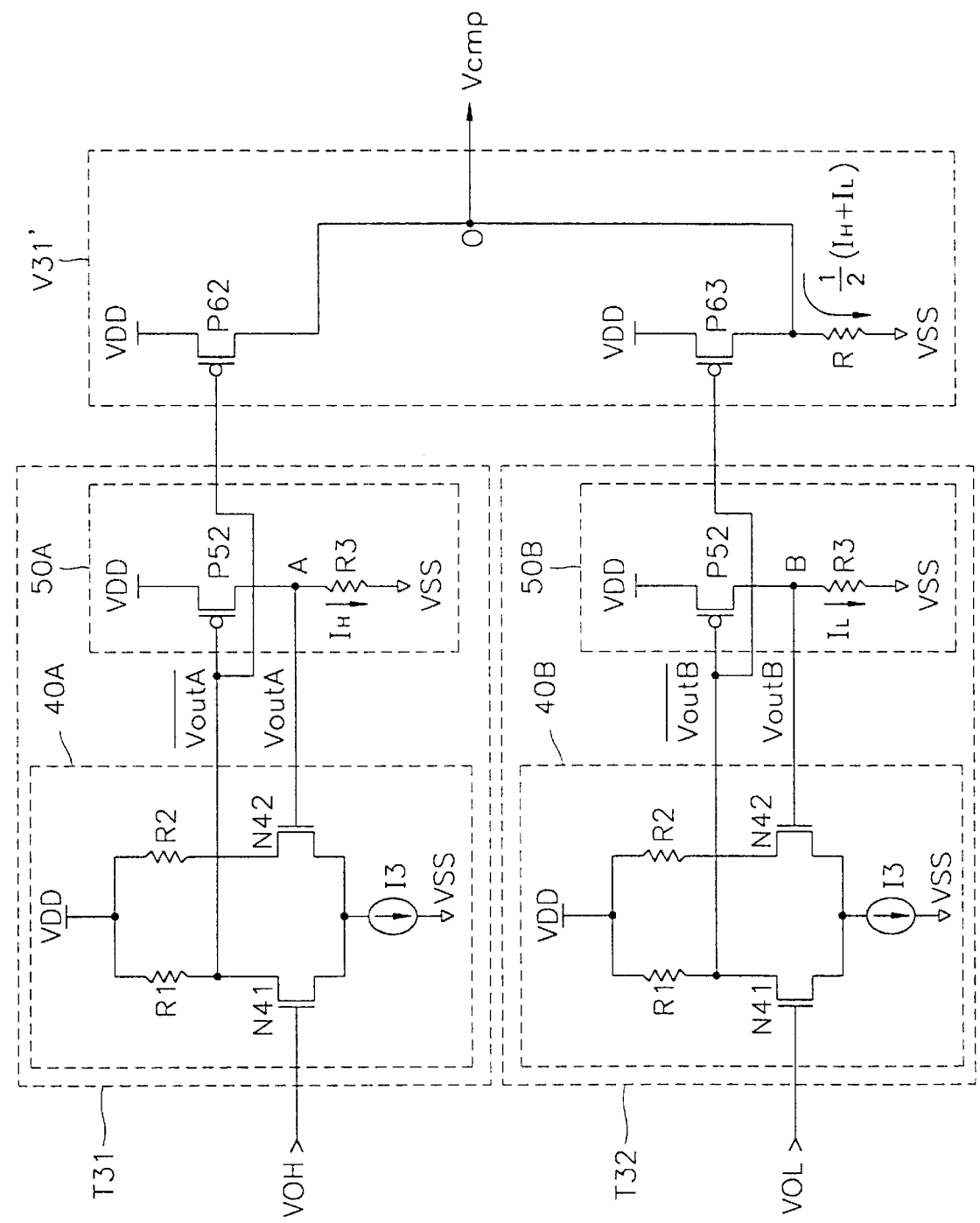
FIG. 5 is a circuit diagram of a current mirror type voltage divider.

FIG. 5 is a circuit diagram of a current mirror type voltage divider V31'. In FIG. 5, the current mirror type voltage divider V31' is shown together with the first and second buffers T31 and T32 of FIG. 3 when the current control enable signal CCTG is activated to logic "high", in order to explain the operation.

Referring to FIG. 5, reference numeral 40A denotes the differential amplification unit of the first buffer T31, and reference numeral 50A denotes the inversion buffer unit of the first buffer T31. Reference numeral 40B denotes the differential amplification unit of the second buffer T32, and reference numeral 50B denotes the inversion buffer unit of the second buffer T32. The resistance of a resistor R1 corresponds to the equivalent resistance of the PMOS load transistor P41 shown in FIG. 4, the resistance of a resistor R2 corresponds to the equivalent resistance of the PMOS load transistor P42 shown in FIG. 4, and the resistance of a resistor R3 corresponds to the equivalent resistance of the NMOS transistor N51 (shown in FIG. 4. A current source 13 is the NMOS current source transistor N43 shown in FIG. 4.

Referring to FIG. 5, the current mirror type voltage divider V31' includes first and second current mirror transistors P62 and P63 and a resistor R. The first current mirror transistor P62 is connected between a power supply voltage VDD and an output node (O) through which the divided voltage Vcmp is output, and mirrors the output current IH of the first buffer T31 in response to the inverted output signal $\overline{VoutA}$ of the first buffer T31. The second current mirror transistor P63 is connected between the output node (O) and a power supply voltage VDD, and mirrors the output current IL of the second buffer T32 in response to the inverted output signal $\overline{VoutB}$ of the second buffer T32. The resistor R is connected between the output node (O) and a ground voltage VSS.

Particularly, the first current mirror transistor P62 is configured such that the ratio of the width of the channel to the length thereof (W/L) is half the ratio (W/L) of the PMOS transistor P52 in the first buffer T31. That is, the first current mirror transistor P62 is configured such that the current driving capability is half of that of the PMOS transistor P52 in the first buffer T31. The second current mirror transistor P63 is configured such that the ratio (W/L) is half the ratio (W/L) of the PMOS transistor P52 in the second buffer T32. That is, the second current mirror transistor P63 is configured such that the current driving capability thereof is half that of the PMOS transistor P52 in the second buffer T32. The resistor R is configured so that it has the same resistance as the resistor R3.

Accordingly, a current of (IH+IL)/2 flows via the resistor $R_1$ and the divided voltage Vcmp becomes (IH+IL)R/2. That is, the divided voltage Vcmp becomes (VOH+VOL)/2.

Hence, when the current mirror type voltage divider V31' shown in FIG. 5 is used as the voltage divider V31 in the current control circuit CT31 shown in FIG. 3, a divided voltage Vcmp having an accurate value of (VOH+VOL)/2 can be obtained even if the manufacturing process, the temperature or the like is changed.

As described above, according to the present invention, the current control circuit, which is a packet type semiconductor memory device, can minimize changes in the output high voltage VOH and output low voltage VOL and quickly obtain an accurate divided voltage in a steady state. Also, in a semiconductor memory device including the current control circuit according to the present invention, the current control circuit minimizes changes in the output high voltage VOH and output low voltage VOL and quickly obtains an accurate divided voltage in a steady state, so that the current driving capability of an output driver can be quickly controlled according to the size of a load which is applied to a pad.

Although the invention has been described with reference to a particular embodiment, it will be apparent to one of ordinary skill in the art that modifications of the described embodiment may be made without departing from the spirit and scope of the invention.

What is claimed is:

1. A current control circuit for controlling the current driving capability of an output driver, the circuit comprising:
    a first transfer means for transmitting the voltage of a first pad in response to a current control enable signal;
    a second transfer means for transmitting the voltage of a second pad in response to the current control enable signal;
    a voltage divider for dividing a voltage ranging between the voltage outputs of the first and second transfer means and outputting the divided voltage;
    a comparator for comparing the divided voltage with a reference voltage; and
    a current control counter for generating control bits for controlling the current driving capability of the output driver, in response to the output of the comparator,
    wherein the first and second transfer means are first and second buffers, respectively, and wherein each of the first and second buffers comprises a respective current source that is responsive to the current control enable signal; and
    wherein the voltage divider is a current mirror type voltage divider having a first input electrically connected to the voltage output of the first transfer means and a second input electrically connected to the voltage output of the second transfer means.

2. The current control circuit of claim 1, wherein the first buffer is a differential amplification type buffer.

3. The current control circuit of claim 1, wherein the first buffer comprises:
    a differential amplification unit for differentially amplifying an input signal and the output signal of the first buffer in response to the current control enable signal; and
    an inversion buffer unit for inversion-buffering the output of the differential amplification unit and outputting the result as the output signal of the first buffer, in response to the current control enable signal.

4. The current control circuit of claim 3, wherein the first input of the current mirror type voltage divider is electrically connected to an input of the inversion buffer unit.

5. The current control circuit of claim 1, wherein the voltage divider comprises:
    a first current mirror transistor connected between a power supply voltage and an output node through which the divided voltage is output, for mirroring the output current of the first transfer means in response to an inverted output of the first transfer means;
    a second current mirror transistor connected between the output node and the power supply voltage, for mirroring the output current of the second transfer means in response to an inverted output of the second transfer means; and
    a resistor connected between the output node and a ground voltage.

6. A semiconductor memory device comprising:
    first and second pads;
    an output driver connected to the second pad, for driving the second pad; and
    a current control circuit for controlling the current driving capability of the output driver,
    wherein the current control circuit comprises:
        a first buffer for transmitting the voltage of the first pad, said first buffer comprising a first differential amplifier having a first current source therein that is responsive to a current control enable signal;
        a second buffer for transmitting the voltage of the second pad, said second buffer comprising a second differential amplifier having a second current source therein that is responsive to the current control enable signal;
        a current mirror type voltage divider for dividing a voltage ranging between the voltage outputs of the first and second buffers and outputting a divided voltage;
        a comparator for comparing the divided voltage with a reference voltage; and
        a current control counter for generating control bits for controlling the current driving capability of the output driver, in response to the output of the comparator.

7. The semiconductor memory device of claim 6, wherein the first buffer comprises a first inversion buffer unit for inversion-buffering the output of the first differential amplifier and outputting the result as the output signal of the first buffer, in response to the current control enable signal.

8. The semiconductor memory device of claim 6, wherein the second buffer comprises a second inversion buffer unit for inversion-buffering the output of the second differential amplifier and outputting the result as the output signal of the second buffer, in response to the current control enable signal.

9. The semiconductor memory device of claim 6, wherein the voltage divider is a current mirror type voltage divider.

10. The semiconductor memory device of claim 6, wherein the voltage divider comprises:
    a first current mirror transistor connected between a power supply voltage and an output node through which the divided voltage is output, for mirroring the output current of the first buffer in response to an inverted output of the first buffer;
    a second current mirror transistor connected between the output node and the power supply voltage, for mirroring the output current of the second buffer in response to an inverted output of the second buffer; and
    a resistor connected between the output node and the ground voltage.

11. A current control circuit for controlling the current driving capability of an output driver, the circuit comprising:
    a first differential amplification type buffer for transmitting the voltage of a first pad in response to a current control enable signal;
    a second differential amplification type buffer for transmitting the voltage of a second pad in response to the current control enable signal;
    a voltage divider connected between the inversion output ports of the first and second differential amplification buffers, for outputting a divided voltage;
    a comparator for comparing the divided voltage with a reference voltage; and
    a current control counter for generating control bits for controlling the current driving capability of the output driver, in response to the output of the comparator,
    wherein the voltage divider is a current mirror type voltage divider.

12. The current control circuit of claim 11, wherein the voltage divider comprises:

a first current mirror transistor connected between a power supply voltage and an output node through which the divided voltage is output, for mirroring the output current of the first differential amplification type buffer in response to an inverted output of the first differential amplification type buffer;

a second current mirror transistor connected between the output node and the power supply voltage, for mirroring the output current of the second differential amplification type buffer in response to an inverted output of the second differential amplification type buffer; and a resistor connected between the output node and a ground voltage.

13. An integrated driver circuit, comprising:

an output driver having a plurality of transistors therein that are electrically connected in parallel between a first output signal line and a reference signal line;

a first buffer circuit having an input electrically coupled to the first output signal line and an output that generates a buffered first output signal having a magnitude proportional to a potential of the first output signal line, said first buffer circuit comprising:
 a first differential amplifier having a first differential input electrically coupled to the first output signal line, a second differential input electrically coupled to the output of said buffer circuit and a current source responsive to a current control enable signal;

a second buffer circuit having an input electrically coupled to a second output signal line and an output that generates a buffered second output signal having a magnitude proportional to a potential of the second output signal line; and an output driver control circuit that is responsive to the buffered first output signal and the buffered second output signal and adjusts a parallel resistance of the plurality of transistors to a level sufficient to enable said output driver to drive the potential of the first output signal line to a target potential, said output driver control circuit comprising a comparator and a current mirror voltage divider having a first input electrically coupled to an output of the first differential amplifier, a second input electrically coupled to an output of the second differential amplifier and an output electrically coupled to an input of the comparator.

14. The circuit of claim 13, wherein said first buffer circuit further comprises a first inverter having an input electrically coupled to an output of the first differential amplifier and an output that is electrically coup led to the second differential input.

15. The circuit of claim 14, wherein said first inverter is responsive to the current control enable signal.

16. An integrated driver circuit comprising:

an output driver having a plurality of transistors therein that are electrically connected in parallel between a first output signal line and a reference signal line;

a first buffer circuit having an input electrically coupled to the first output signal line and an output that generates a buffered first output signal having a magnitude proportional to a potential of the first output signal line, said first buffer circuit comprising:
 a first differential amplifier circuit having a first differential input electrically coupled to the first output signal line;
 a second differential input electrically coupled to the output of said first buffer circuit; and
 a first inverter having an input electrically coupled to an output of the first differential amplifier and an output that is electrically coupled to the second differential input, said first inverter comprising:
  first and second PMOS transistors electrically connected in series between a power supply signal line and the output of the first inverter; and
  first and second NMOS transistors electrically connected in series between the output of the first inverter and the reference signal line;
  wherein the first NMOS transistor and the first PMOS transistor are responsive to a current control enable signal and a complementary current control enable signal, respectively; and
  wherein the second NMOS transistor and the second PMOS transistor are responsive to the output of the first differential amplifier;

a second buffer circuit having an input electrically coupled to a second output signal line and an output that generates a buffered second output signal having a magnitude proportional to a potential of the second output signal line; and an output driver control circuit that is responsive to the buffered first output signal and the buffered second output signal and adjusts a parallel resistance of the plurality of transistors to a level sufficient to enable said output driver to drive the potential of the first output signal line to a target potential.

17. The circuit of claim 14, wherein said second buffer circuit comprises:

a second differential amplifier circuit having a first differential input electrically coupled to the second output signal line; and a second inverter having an input electrically coupled to an output of the second differential amplifier and an output that is electrically coupled to a second differential input of the second differential amplifier.

18. The circuit of claim 17, wherein the current mirror voltage divider comprises first and second MOS transistors; wherein a gate electrode of the first MOS transistor is electrically coupled to the output of the first differential amplifier; and wherein a gate electrode of the second MOS transistor is electrically coupled to the output of the second differential amplifier.

* * * * *